US012609613B2

(12) United States Patent 
Lee et al.

(10) Patent No.: US 12,609,613 B2 
(45) Date of Patent: Apr. 21, 2026

(54) ZERO CURRENT DETECTION CIRCUIT AND BOOST TYPE POWER CONVERTER EMPLOYING THE SAME

(71) Applicants: SKAIChips Co., Ltd., Suwon-si (KR); Research & Business Foundation SUNGKYUNKWAN UNIVERSITY, Suwon-si (KR)

(72) Inventors: Kang Yoon Lee, Seoul (KR); Ju Won Oh, Suwon-si (KR); Yu Sub Shin, Suwon-si (KR); Jong Wan Jo, Suwon-si (KR)

(73) Assignees: SKAIChips Co., Ltd., Suwon-si (KR); Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 202 days.

(21) Appl. No.: 18/396,728

(22) Filed: Dec. 27, 2023

(65) Prior Publication Data

US 2025/0158522 A1 May 15, 2025

(30) Foreign Application Priority Data

Nov. 15, 2023 (KR) ........................ 10-2023-0157893

(51) Int. Cl.
| | |
|---|---|
| *H02M 3/157* | (2006.01) |
| *H02M 1/00* | (2006.01) |
| *H03K 5/24* | (2006.01) |

(52) U.S. Cl.
CPC ......... *H02M 3/157* (2013.01); *H02M 1/0009* (2021.05); *H03K 5/2481* (2013.01); *H03K 5/249* (2013.01)

(58) Field of Classification Search
CPC ..... H02M 3/157; H02M 1/0009; H02M 3/158
See application file for complete search history.

(56) References Cited

U.S. PATENT DOCUMENTS

| | | | |
|---|---|---|---|
| 8,692,582 B1 | 4/2014 | Atesoglu et al. | |
| 2004/0027265 A1 | 2/2004 | Michalski | |
| 2008/0298106 A1* | 12/2008 | Tateishi | H02M 3/1588 |
| | | | 363/127 |
| 2017/0179823 A1* | 6/2017 | Dash | G01R 19/00 |

FOREIGN PATENT DOCUMENTS

| | | |
|---|---|---|
| JP | 2015-053676 A | 3/2015 |
| KR | 10-2021-0143073 A | 11/2021 |

OTHER PUBLICATIONS

Office Action mailed on Apr. 10, 2025 from Korean Patent Office for Application No. 10-2023-0157893.
European Search Report dated Jun. 20, 2024 from European Patent Office for Application No. 23220428.9.

* cited by examiner

*Primary Examiner* — Alex Torres-Rivera

(57) ABSTRACT

A technology associated with an electrical circuit, in particular, a zero current detection circuit, is disclosed. The disclosed zero current detection circuit includes a plurality of dynamic comparators. Operating clocks of the dynamic comparators are generated by a plurality of flip-flops each configured to latch an output of one dynamic comparator corresponding thereto and then to supply the latched output as a clock of another dynamic comparator downstream of the former dynamic comparator. The dynamic comparators is activated as power is supplied thereto only in a required period of a charging/discharging cycle of a boost type power converter.

10 Claims, 9 Drawing Sheets

ZERO CURRENT DETECTION CIRCUIT AND BOOST TYPE POWER CONVERTER EMPLOYING THE SAME

BACKGROUND OF THE INVENTION

Field of the Invention

The present invention discloses a technology associated with a zero current detection circuit configured to detect a moment when no current flows in an electrical circuit, in particular, between two nodes which are targets to be detected. The zero current detection circuit is employed as a part for managing power efficiency in a power converter such as, for example, a DC-DC converter.

Description of the Related Art

A zero current detection circuit is a circuit for detecting a moment when no current flows between two terminals. In a DC-DC converter, a current flow is alternately repeated between a high-side power transistor and a low-side power transistor in accordance with charging and discharging operations of an inductor. When switching times of the transistors are incorrect in this case, a phenomenon in which energy charged in the inductor is insufficiently transferred, or current flows backwards may occur, thereby degrading power conversion efficiency.

In a power conversion circuit for energy harvesting applications, sub-circuits constituting the power conversion circuit operate by converted power. In this case, the sub-circuits consume output power of the power conversion circuit and, as such, the power consumption greatly influences the efficiency of the power conversion circuit.

SUMMARY OF THE INVENTION

Therefore, the present invention has been made in view of the above problems, and it is an object of the present invention to provide a new structure of a zero current detection circuit capable of achieving a reduction in power consumption.

Another object of the present invention is to provide a zero current detection circuit capable of detecting a zero current point at high accuracy while operating by reduced power.

Another object of the present invention is to provide a power conversion circuit capable of enhancing conversion efficiency while achieving reduced power consumption by itself.

In accordance with an aspect of the present invention, a zero current detection circuit includes a plurality of dynamic comparators, wherein operating clocks of the dynamic comparators are generated by a plurality of flip-flops each configured to latch an output of one of the dynamic comparators corresponding thereto and then to supply the latched output as a clock of another dynamic comparator downstream of the corresponding dynamic comparator.

In accordance with another aspect of the present invention, dynamic comparators are activated by power supplied only in a required period of a charging/discharging cycle of a boost type power converter.

In detail, the boost type power converter may be controlled such that a pre-amplifier of a dynamic comparator is turned on during a period in which a low-side power switch is switched off.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The above-described aspects and additional aspects are implemented through embodiments described with reference to the accompanying drawings. It is understood that constituent elements of each embodiment may be diversely combined with one another in the embodiment or may be diversely combined with constituent elements of other embodiments, unless otherwise specifically noted or so long as there is no contradiction in such combination. It should be understood that the terms used in the specification and appended claims should be interpreted based on the meanings and concepts according to contents of description or proposed technical ideas on the basis of the principle that the inventor is allowed to define terms appropriately for best explanation. Hereinafter, preferred embodiments of the present invention will be described in detail with reference to the accompanying drawings.

<Description of Invention of Claim 1>

Figure 1:
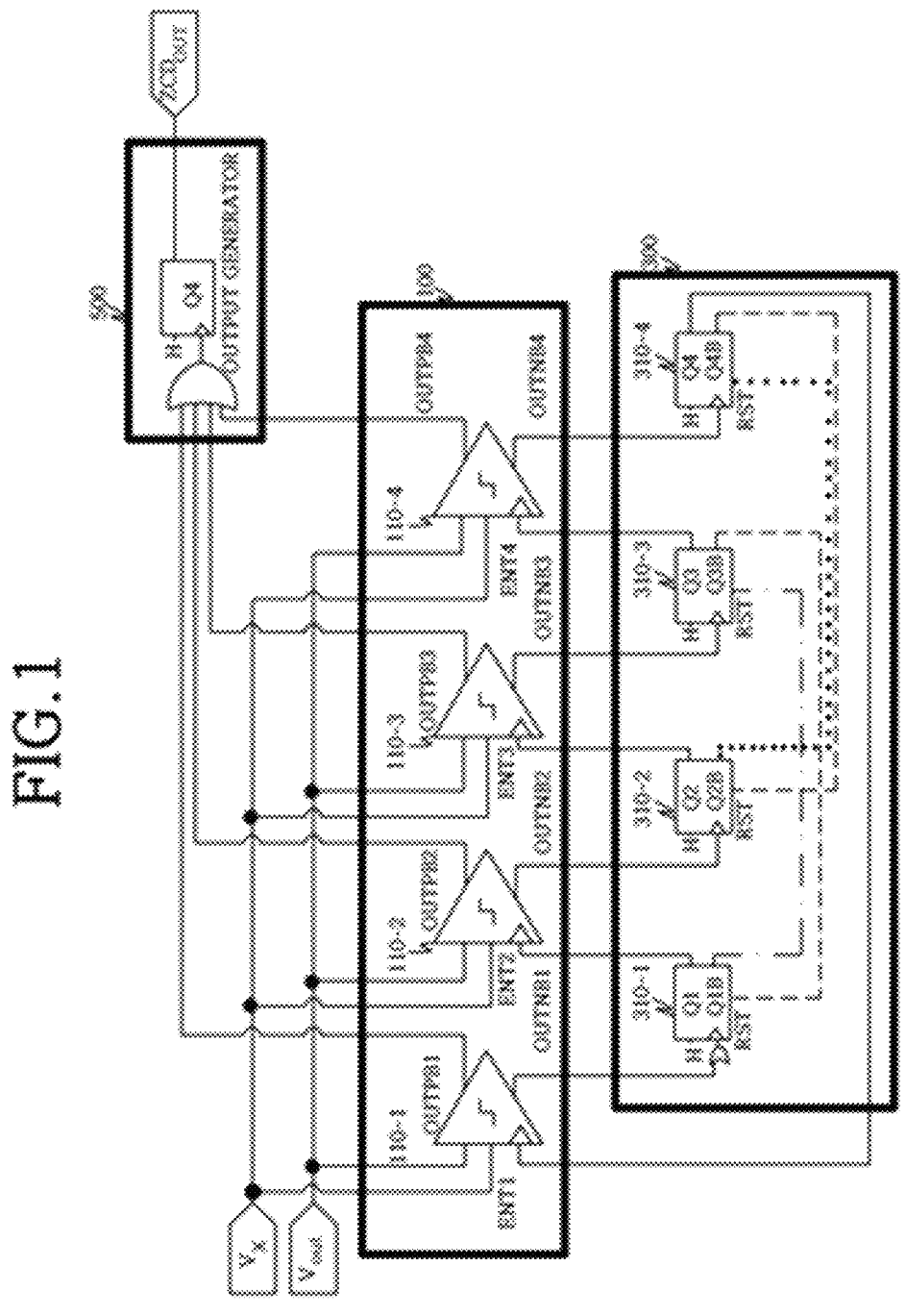
FIG. 1 shows a configuration of a zero current detection circuit according to an embodiment of the present invention.

In accordance with one aspect of the proposed invention, a zero current detection circuit may include a plurality of dynamic comparators, and operating clocks of the dynamic comparators may be generated by a plurality of flip-flops each configured to latch an output of one dynamic comparator corresponding thereto and then to supply the latched output as a clock of another dynamic comparator downstream of the corresponding dynamic comparator. FIG. 1 shows a configuration of a zero current detection circuit according to an embodiment to which the above-described aspect is applied. As shown in FIG. 1, the zero current detection circuit according to the embodiment includes a comparison circuit 100, a clock generator 300, and an output generator 500. Although the comparison circuit 100 is shown in the illustrated embodiment as including four dynamic comparators 110-1 to 110-4, it is obvious to those skilled in the art from ideas of the invention that the comparison circuit 100 may include a greater or smaller number of dynamic comparators than that of the shown case.

A pair of detection nodes is connected to input terminals of each of the dynamic comparators 110-1 to 110-4. In the illustrated embodiment, voltages of the detection nodes, that is, V1 and V2, are applied to respective input terminals of each of the dynamic comparators 110-1 to 110-4. Such a dynamic comparator has advantages of high latching speed and low static power consumption by virtue of positive feedback, as compared to a static comparator.

The clock generator 300 includes a plurality of flip-flops 310-1 to 310-4. Each of the flip-flops 310-1 to 310-4 receives, as a clock signal, an output of an upstream one of the dynamic comparators 110-1 to 110-4, and then outputs the received signal as a clock input of a downstream one of the dynamic comparators 110-1 to 110-4. For example, the flip-flop 310-1, that is, a flip-flop Q1, receives, as a clock signal, an output of the dynamic comparator 110-1 upstream thereof, and outputs the received signal as a clock input of the dynamic comparator 110-2 downstream thereof. Similarly, the flip-flop 310-2, that is, a flip-flop Q2, receives, as a clock signal, an output of the dynamic comparator 110-2 upstream thereof, and outputs the received signal as a clock input of the dynamic comparator 110-3 downstream thereof. The flip-flop 310-3, that is, a flip-flop Q3, receives, as a clock signal, an output of the dynamic comparator 110-3 upstream thereof, and outputs the received signal as a clock input of the dynamic comparator 110-4 downstream thereof. The flip-flop 310-4, that is, a flip-flop Q4, receives, as a clock signal, an output of the dynamic comparator 110-3 upstream thereof, and outputs the received signal as a clock input of the dynamic comparator 110-1 downstream thereof.

In other words, an output pulse of a first dynamic comparator generates a clock input signal of a second dynamic comparator, an output pulse of the second dynamic comparator generates a clock input signal of a third dynamic comparator, an output pulse of the third dynamic comparator generates a clock input signal of a fourth dynamic comparator, and an output pulse of the fourth dynamic comparator generates a clock input signal of the first dynamic comparator. In this regard, the entirety of the plurality of dynamic comparators 110-1 to 110-4 and the plurality of flip-flops 310-1 to 310-4 constitute a clock loop by themselves. Clock signals having different phases are sequentially input to respective dynamic comparators, and each of the dynamic comparators detects zero current at a moment when the clock signal input thereto is activated, thereby outputting a detection pulse. Since a clock required for operation of each dynamic comparator is generated without provision of a separate oscillator, it may be possible to achieve a reduction in chip area or a reduction in power consumption.

The output generator 500 logically ORs outputs of a plurality of dynamic comparators. Accordingly, in the case in which at least one of the plurality of dynamic comparators 110-1 to 110-4 detects zero current, thereby outputting a pulse, the output generator 500 may externally output the pulse through a single output terminal.

Figure 2:
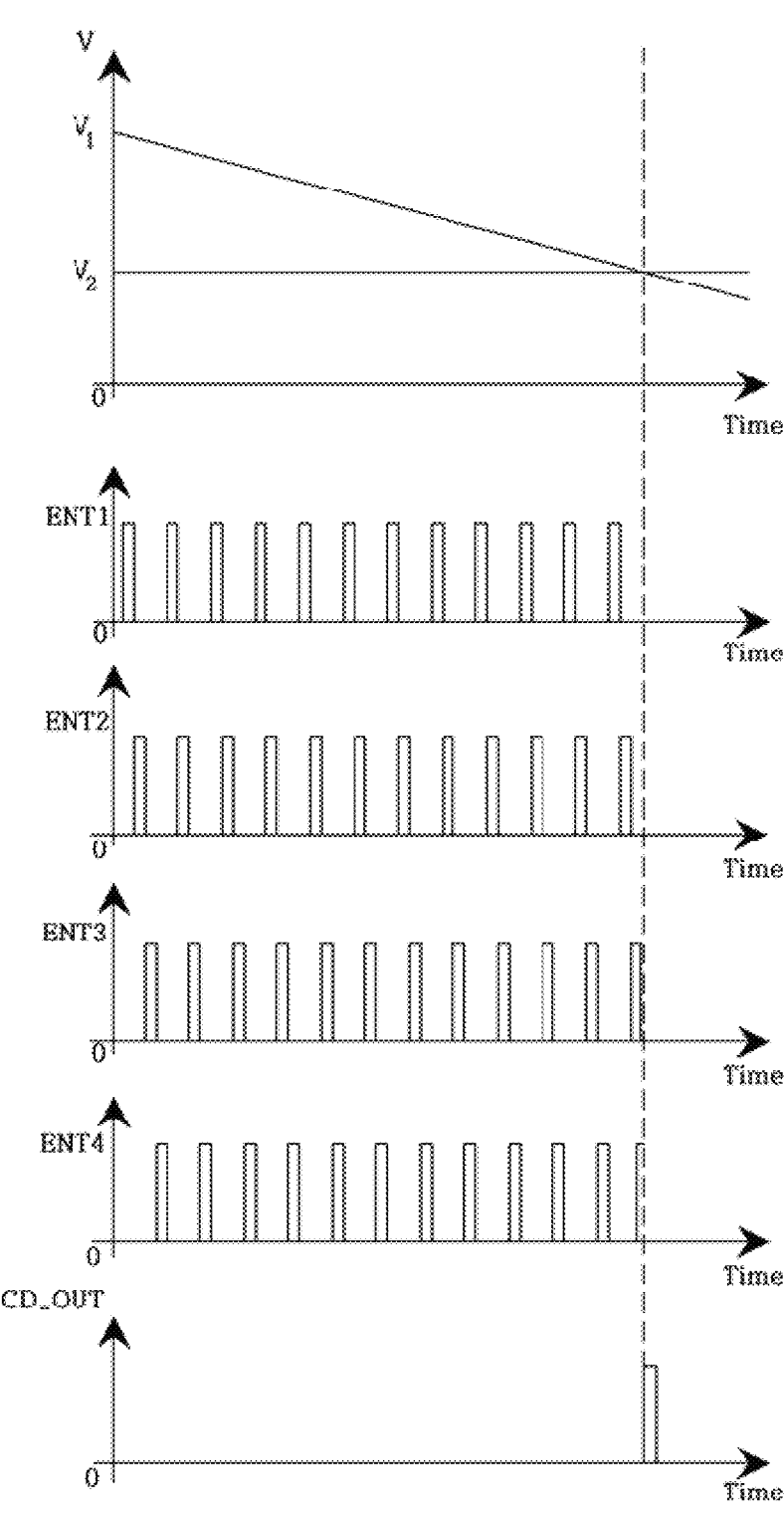
FIG. 2 is a timing diagram explaining an illustrative operation of the zero current detection circuit shown in FIG. 1.

FIG. 2 is a timing diagram explaining an illustrative operation of the zero current detection circuit shown in FIG. 1. As shown in FIG. 2, among voltages of a detection node pair, the voltage $V_2$ is stable, and the voltage $V_1$ at an input terminal repeats rising and falling. Phase relations of clock inputs activating respective dynamic comparators 110-1 to 110-4, for detection of a point, at which the voltage V1 and the voltage V2 cross each other, indicated by a dotted line, is illustrated in FIG. 2. Since phases of clocks are sequential, the dynamic comparators 110-1 to 110-4 are sequentially activated. The dynamic comparator 110-4, to which a clock ENT4 activated at a moment when the voltage V1 and the voltage V2 cross each other is suppled, detects the moment, thereby outputting a pulse. The output generator 500 externally outputs the pulse as a signal ZCD_OUT.

<Description of Invention of Claim 2>

Figure 3:
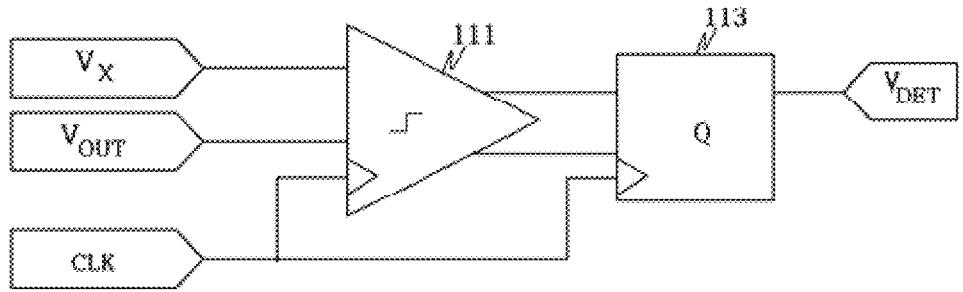
FIG. 3 shows a configuration of a dynamic comparator according to an embodiment of the present invention.

FIG. 3 shows a configuration of the dynamic comparator according to an embodiment. As shown in FIG. 3, the dynamic comparator according to the embodiment includes a pre-amplifier 111 and a dynamic latch 113. The pre-amplifier 111 differentially amplifies input signals. The dynamic latch 113 is synchronized with an input clock, thereby outputting a pulse at a moment when an output of the pre-amplifier 113 becomes 0. The pre-amplifier 111 determines an offset voltage, and the dynamic latch 113 determines an operation speed of the dynamic comparator. The configuration of such a dynamic comparator is known and, as such, no detailed description thereof will be given.

<Description of Invention of Claim 3>

Again referring to FIG. 1, in the clock loop of the clock generator 300, to a reset terminal of each of the flip-flops 310-1 to 310-4, an output of an upstream one of flip-flops 310-1 to 310-4 is connected. In the the illustrated embodiment, a negative output of the flip-flop 310-3 is connected to a reset terminal RST of the flip-flop 310-1, a negative output of the flip-flop 310-4 is connected to a reset terminal RST of the flip-flop 310-2, a negative output of the flip-flop connected to a reset terminal RST of the flip-flop 310-3, and a negative output of the flip-flop 310-2 is connected to a reset terminal RST of the flip-flop 310-4. Although two upstream outputs are connected to each flip-flop in the illustrated embodiment, this is selective in design, and may be selected in accordance with how the pulse width of an output pulse is designed.

<Description of Invention of Claim 4>

Figure 4:
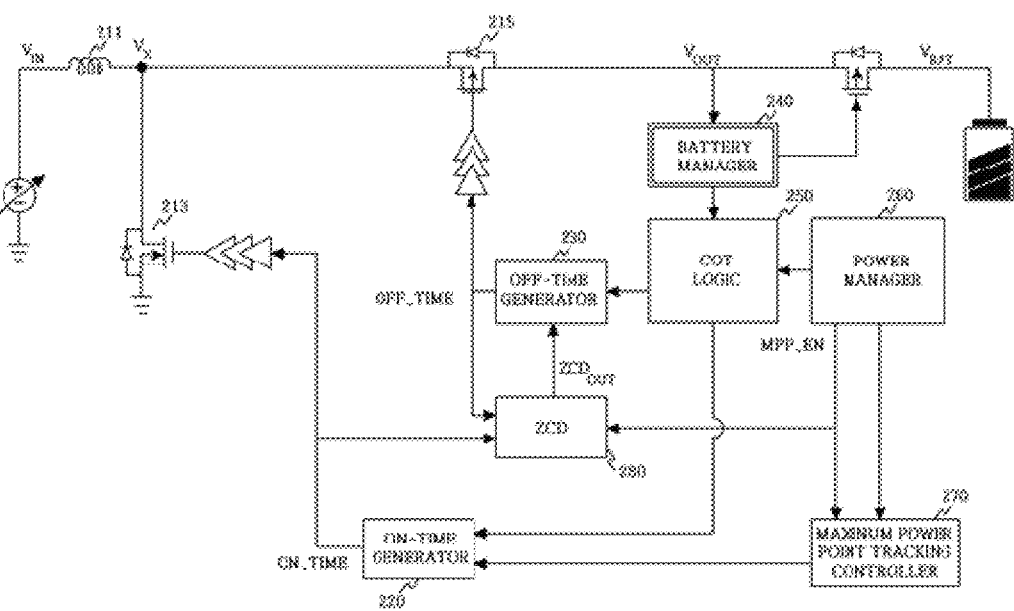
FIG. 4 shows a configuration of a boost type power converter according to an embodiment of the present invention.

FIG. 4 shows a configuration of a boost type power converter according to an embodiment of the present invention. The illustrated embodiment is designed for energy harvesting applications. The boost type power converter of the illustrated embodiment operates in a constant-on-time (COT) manner, and tracks a maximum power point of input power through a maximum power point tracking (MPPT) circuit. As shown in FIG. 4, the boost type power converter according to the illustrated embodiment includes a main inductor 211, a low-side power switch 213, a high-side power switch 215, an on-time generator 220, an off-time generator 230, and a zero current detection circuit 280.

The main inductor 211, the low-side power switch 213, the high-side power switch 215, the on-time generator 220, and the off-time generator 230 are general functional blocks of a boost converter. The main inductor 211 is an energy storage device configured to charge and discharge input power therein and therefrom. The low-side power switch 213 regulates charging of power charged therein into the main inductor 211. The high-side power switch 215 regulates discharge of power charged in the main inductor 211 to a load. The on-time generator 220 generates an on-time signal ON_TIME which is a control signal for the low-side power switch 213. The off-time generator 230 generates an off-time signal OFF_TIME which is a control signal for the high-side power switch 215. In the illustrated embodiment, the low-side power switch 213 is switched on during activation of the on-time signal ON_TIME output from the on-time generator 220, in order to enable charging of input power in the main inductor 211, and the high-side power switch 215 is switched on during activation of the off-time signal OFF_TIME output from the off-time generator 230, in order to enable supply of power charged in the main inductor 211 to a load.

In the illustrated embodiment, the on-time generator 220 and the off-time generator 230 are controlled by a constant-on-time (COT) logic 250. The COT logic 250 is internally equipped with a logic configured to induce an operation in a constant-on-time (COT) manner and, as such, may manage an on-time to be constant. When an input voltage cannot reach a target voltage by a maximum power point tracking controller 270, the COT logic 250 may operate to increase the on-time. A battery manager 240 monitors an output voltage $V_{OUT}$, thereby determining whether or not a system operation and a battery charging operation should be performed, based on a level of the output voltage $V_{OUT}$. The boost type power converter of the illustrated embodiment is configured to charge a battery from a time when the output voltage $V_{OUT}$ reaches 3V and to maintain charging until the output voltage $V_{OUT}$ reaches 4.2V. The maximum power point tracking controller 270 determines an on-time to track a maximum power point of the input power, and outputs the determined on-time to the on-time generator 220. A power manager 260 is a circuit configured to generate a reference voltage or current and a clock signal required for operations of the COT logic 250 and the maximum power point tracking controller 270. In particular, the power manager 260 generates and outputs a signal MPP_EN, thereby periodically restarting the maximum power point tracking controller 270.

When the low-side power switch 213 is switched on in the shown boost type power converter, input power is charged in the inductor 211. Subsequently, when the low-side power switch 213 is switched off, and the high-side power switch 215 is switched on, power charged in the inductor 211 is supplied to a load until the high-side power switch 215 is switched off. When the high-side power switch 215 is switched off early, current charged in the inductor 211 is incompletely transferred to the load, thereby causing a reduction in power conversion efficiency. On the other hand, when the high-side power switch 215 is switched off late, backward flow of current to the inductor 211 occurs, thereby causing a reduction in power conversion efficiency. In order to prevent such efficiency reduction, the boost type power converter requires s a zero current detection circuit.

In the illustrated embodiment, the zero current detection circuit 280 forcibly cuts off an off-time signal OFF_TIME upon detecting zero current. When an off-time signal OFF-_TIME is output from the off-time generator 230 after outputting of an on-time signal ON_TIME from the on-time generator 220, the zero current detection circuit 280 starts an operation thereof. Subsequently, when the current of the inductor 211 reaches a zero current point, the zero current detection circuit 280 outputs a zero current detection signal $ZCD_{OUT}$ to the off-time generator 230, thereby controlling the off-time generator 230 to cut off an off-time signal OFF_TIME for control of a transistor which is the high-side power switch 215.

Figure 5:
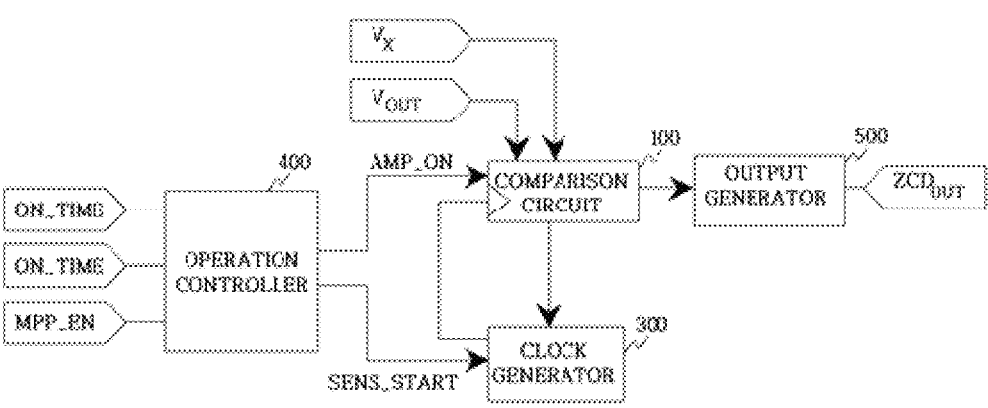
FIG. 5 is a block diagram showing a configuration of a zero current detection circuit according to an embodiment of the present invention applicable to the boost type power converter illustrated in FIG. 4.

<Description of FIG. 5>

FIG. 5 is a block diagram showing a configuration of a zero current detection circuit according to an embodiment of the present invention applicable to the boost type power converter illustrated in FIG. 4. Constituent elements corresponding to those of the embodiment illustrated in FIG. 1 are designated by the same reference numerals as those of FIG. 1, respectively. As shown in FIG. 5, the zero current detection circuit according to the illustrated embodiment includes a comparison circuit 100, a clock generator 300, and an output generator 500. The comparison circuit 100 receives a switching node voltage and an output node voltage of the boost type power converter, thereby detecting a zero current state. The clock generator 500 is a circuit configured to generate a clock signal required for operation of the comparison circuit 100. The output generator 500 generates a zero current detection signal based on an output of the comparison circuit 100, and then outputs the zero current detection signal. An operation controller 400 receives, from the boost type power converter, an on-time signal ON_TIME, which is an output of the on-time generator 200, an off-time signal OFF_TIME, which is an output of the off-time generator 230, and a signal MPP_EN, which is one of outputs of the power manager 260, thereby generating and outputting a signal AMP_ON as a control signal for activating operation of the comparison circuit 100 and a signal SENS_START as a control signal for activating operation of the clock generator 300.

Figure 6:
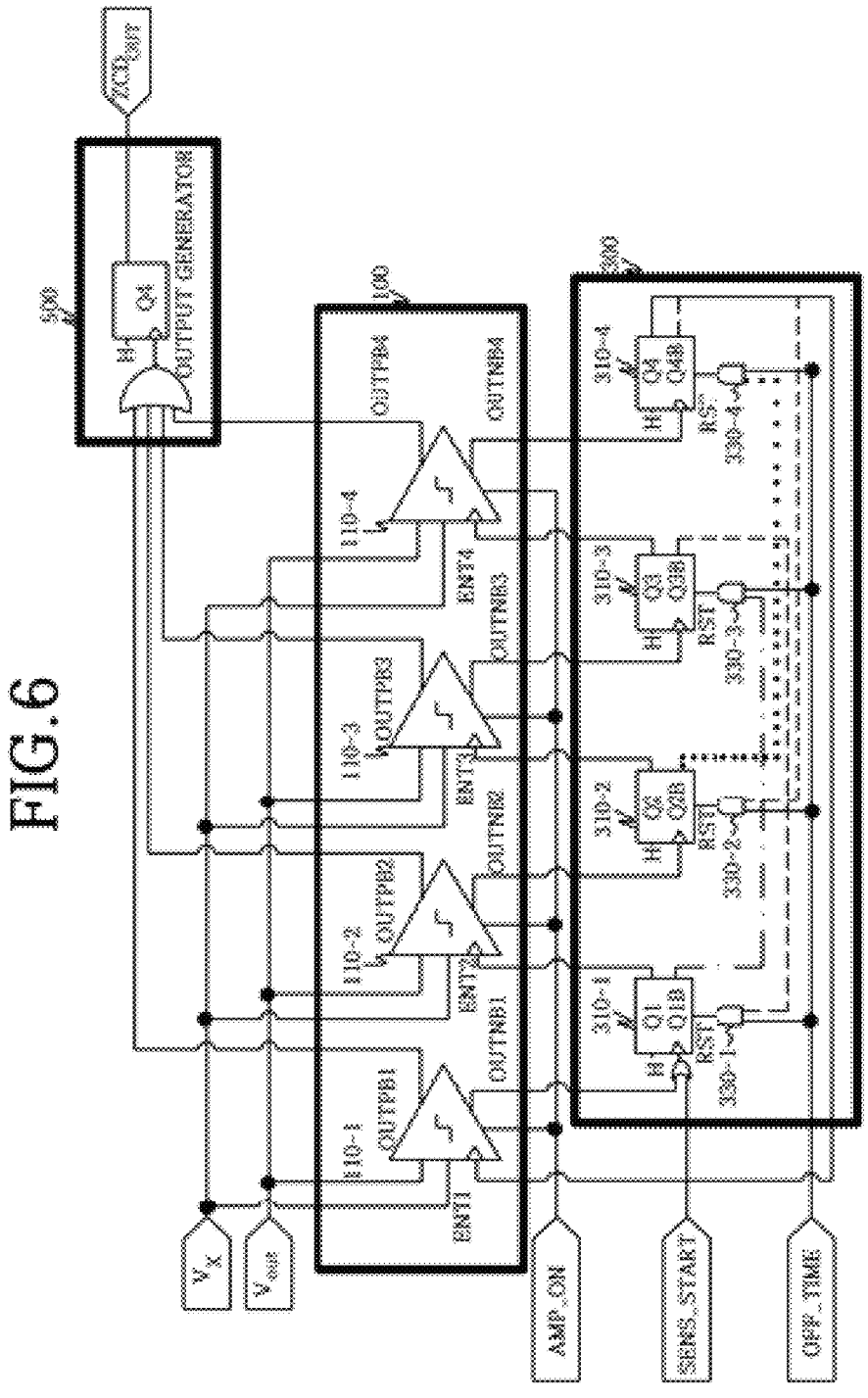
FIG. 6 shows detailed configurations of a comparison circuit, a clock generator, and an output generator in the embodiment of FIG. 5.

FIG. 6 shows detailed configurations of the comparison circuit, the clock generator, and the output generator in the embodiment of FIG. 5. Constituent elements corresponding to those of the embodiment illustrated in FIG. 1 are designated by the same reference numerals as those of FIG. 1, respectively. A detection node pair, that is, a switching node and an output node of the boost type power converter, is connected to input terminals of each dynamic comparator in the comparison circuit 100. In the illustrated embodiment, one terminal of the low-side power switch of the boost type power converter is connected to one input terminal of each of dynamic comparators 110-1 to 110-4 such that a low-side voltage $V_X$ is applied to the one input terminal, and one terminal of the high-side power switch of the boot type power converter is connected to another input terminal of each of the dynamic comparators 110-1 to 110-4 such that a high-side voltage $V_{OUT}$ is applied to the other input terminal.

The clock generator 500 is a circuit configured to generate a clock signal required for operation of the comparison circuit 100. The clock generator 500 includes a plurality of flip-flops 310-1 to 310-4. Each of the flip-flops 310-1 to 310-4 receives, as a clock signal, an output of an upstream one of the dynamic comparators 110-1 to 110-4, and then outputs the received signal as a clock input of a downstream one of the dynamic comparators 110-1 to 110-4. For example, the flip-flop 310-1, that is, a flip-flop Q1, receives, as a clock signal, an output of the dynamic comparator 110-1 upstream thereof, and outputs the received signal as a clock input of the dynamic comparator 110-2 downstream thereof. Similarly, the flip-flop 310-2, that is, a flip-flop Q2, receives, as a clock signal, an output of the dynamic comparator 110-2 upstream thereof, and outputs the received signal as a clock input of the dynamic comparator 110-3 downstream thereof. The flip-flop 310-3, that is, a flip-flop Q3, receives, as a clock signal, an output of the dynamic comparator 110-3 upstream thereof, and outputs the received signal as a clock input of the dynamic comparator 110-4 downstream thereof. The flip-flop 310-4, that is, a flip-flop Q4, receives, as a clock signal, an output of the dynamic comparator 110-3 upstream thereof, and outputs the received signal as a clock input of the dynamic comparator 110-1 downstream thereof.

In other words, an output pulse of a first dynamic comparator generates a clock input signal of a second dynamic comparator, an output pulse of the second dynamic comparator generates a clock input signal of a third dynamic comparator, an output pulse of the third dynamic comparator generates a clock input signal of a fourth dynamic comparator, output pulse of the fourth dynamic comparator generates a clock input signal of the first dynamic comparator. In this regard, the entirety of the plurality of dynamic comparators 110-1 to 110-4 and the plurality of flip-flops 310-1 to 310-4 constitute a clock loop by themselves. Clock signals having different phases are sequentially input to respective dynamic comparators, and each of the dynamic comparators detects zero current at a moment when the clock signal input thereto is activated, thereby outputting a detection pulse. Since a clock required for operation of each dynamic comparator is generated without provision of a separate oscillator, it may be possible to achieve a reduction in chip area or a reduction in power consumption.

The output generator 500 logically ORs outputs of a plurality of dynamic comparators. Accordingly, in the case in which at least one of the plurality of dynamic comparators 110-1 to 110-4 detects zero current, thereby outputting a pulse, the output generator 500 may externally output the pulse through a single output terminal.

<Description of Invention of Claim 5>

Figure 7:
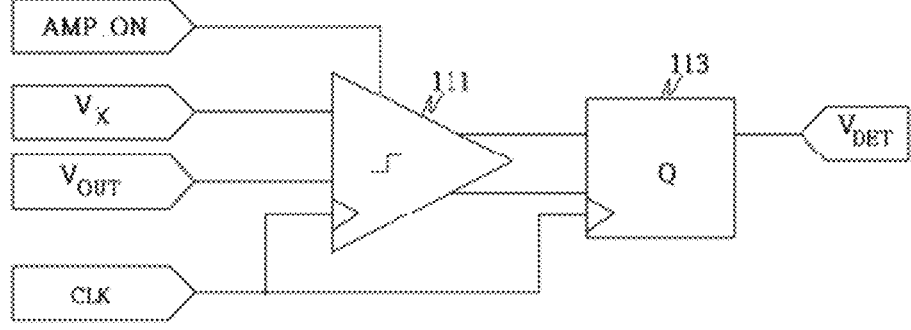
FIG. 7 shows a configuration of one dynamic comparator in the embodiment of FIG. 6.

FIG. 7 shows a configuration of one dynamic comparator in the embodiment of FIG. 6. As shown in FIG. 7, in accordance with an embodiment, the dynamic comparator includes a pre-amplifier 111 and a dynamic latch 113.

The pre-amplifier 111 receives a switching node voltage $V_X$ and an output node voltage $V_{OUT}$ from a power converter, thereby outputting a difference voltage between the switching node voltage $V_X$ and the output node voltage $V_{OUT}$. The dynamic latch 113 receives an output voltage from the pre-amplifier 111, and outputs, through comparison, a zero current detection pulse signal ZCD_OUT at a moment when the switching node voltage $V_X$ and the output node voltage $V_{OUT}$ cross each other.

In the case of a boost type power converter, a voltage is detected at a moment when input power is charged in an inductor, that is, when a voltage of the inductor becomes high. In the boost type power converter, accordingly, a pre-amplifier is provided in order to secure a stable operation of a comparator. The pre-amplifier 111 differentially amplifies the switching node voltage $V_X$ and the output node voltage $V_{OUT}$, and additionally drops the resultant voltages by a gain value, thereby securing a stable operation of the dynamic latch 113. In addition, the comparison circuit 100 includes the plurality of dynamic comparators 110-1 to 110-4 and, as such, has an advantage in that such a dynamic comparator exhibits reduced power consumption, as compared to a static comparator. The four dynamic comparators 110-1 to 110-4 sequentially operate one by one without operating simultaneously.

In the illustrated embodiment, the pre-amplifier 111 operates during activation of a signal AMP_ON, thereby differentially amplifying input signals. When the signal AMP_ON is deactivated, a flow of current in the pre-amplifier 111 is cut off and, as such, power consumption is minimized. The dynamic latch 113 is synchronized with an input clock, thereby outputting a pulse at a moment when an output of the pre-amplifier 113 becomes 0. The pre-amplifier 111 determines an offset voltage, and the dynamic latch 113 determines an operation speed of the dynamic comparator. The configuration of such a dynamic comparator is known and, as such, no detailed description thereof will be given.

<Description of Invention of Claim 6>

Again referring to FIG. 6, in a loop, to a reset terminal RST of each of the flip-flops 310-1 to 310-4, an output of an upstream one of the flip-flops 310-1 to 310-4 is connected. In the illustrated embodiment, a negative output of the flip-flop 310-3 is connected to a reset terminal RST of the flip-flop 310-1, a negative output of the flip-flop 310-4 is connected to a reset terminal of the flip-flop 310-2, a negative output of the flip-flop 310-1 is connected to a reset terminal of the flip-flop 310-3, and a negative output of the flip-flop 310-2 is connected to a reset terminal of the flip-flop 310-4. Although two upstream outputs are connected to each flip-flop in the illustrated embodiment, this is selective in design, and may be selected in accordance with how the pulse width of an output pulse is designed.

<Description of Invention of Claim 7>

In accordance with another aspect, each flip-flop of the clock generator is configured to be reset in accordance with an output of another flip-flop upstream thereof during a period in which the high-side power switch discharges power to a load. In the case of FIG. 6, the clock generator 300 includes a plurality of AND elements 330-1 to 330-4. Each of the AND elements 330-1 to 330-4 is connected, at an output terminal thereof, to a reset terminal of one flip-flop while being connected, at input terminals thereof, to an output terminal of another flip-flop upstream of the former flip-flop and an output terminal of an off-time generator, respectively, in a loop. Accordingly, when an off-time signal is in an activated state, that is, when power of an inductor is discharged to a load in accordance with connection of the high-side power switch to the inductor, a resettable state is obtained.

Figure 9:
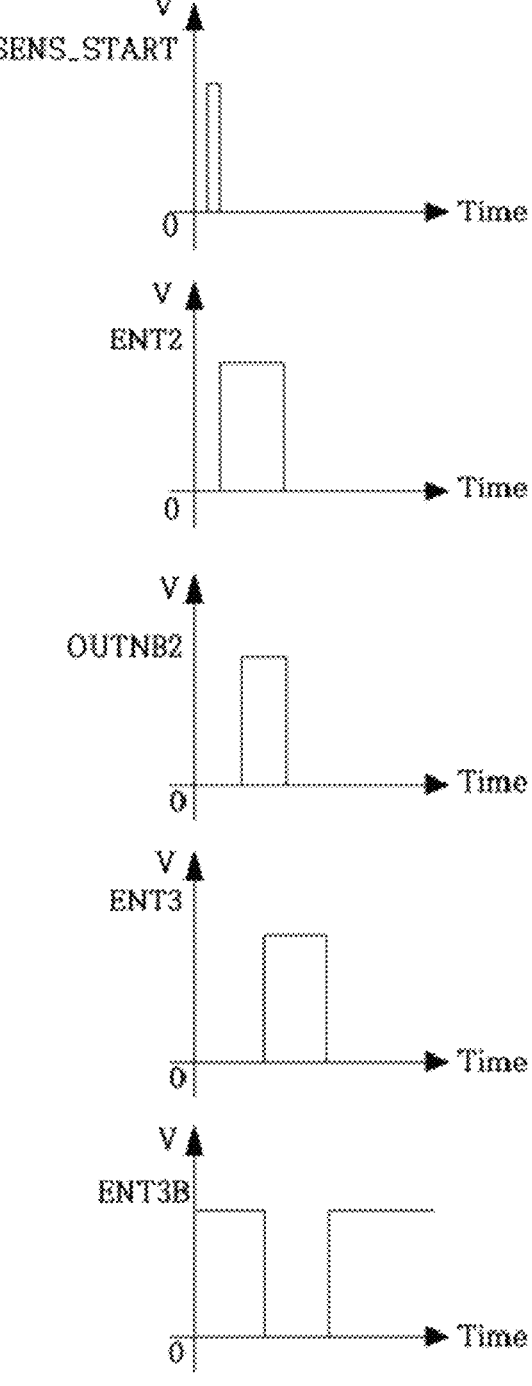
FIG. 9 is a timing diagram explaining operation of a clock generator.

FIG. 9 is a timing diagram explaining operation of the clock generator 300. As shown in FIG. 9, a first flip-flop Q1 receives a signal SENS_START as a clock, thereby generating an output ENT2, and a dynamic comparator 110-2, which starts a first operation, receives the signal ENT2. When the current time is not a moment when a switching node voltage $V_X$ and an output node voltage $V_{OUT}$ cross each other, the dynamic comparator 110-2, which receives the signal ENT2, generates a negative output OUTNB2. Accordingly, a second flip-flop Q2 operates, thereby outputting a signal ENT3. At this time, an output signal ENT3B of the second flip-flop Q2 becomes an off state. When the output signal ENT3B becomes an off state, the signal ENT2 becomes an off state. All flip-flops repeatedly sequentially operate in order of ENT2→ENT3→ENT4→ENT1 until a moment when the switching node voltage $V_X$ and the output node voltage $V_{OUT}$ cross each other is detected. When the voltage crossing moment is detected from any one of outputs of four dynamic comparators 110-1 to 110-4 and, as such, a pulse is generated, a signal ZCD_OUT signal is generated from the output generator 500.

<Description of Invention of Claim 8>

Figure 8:
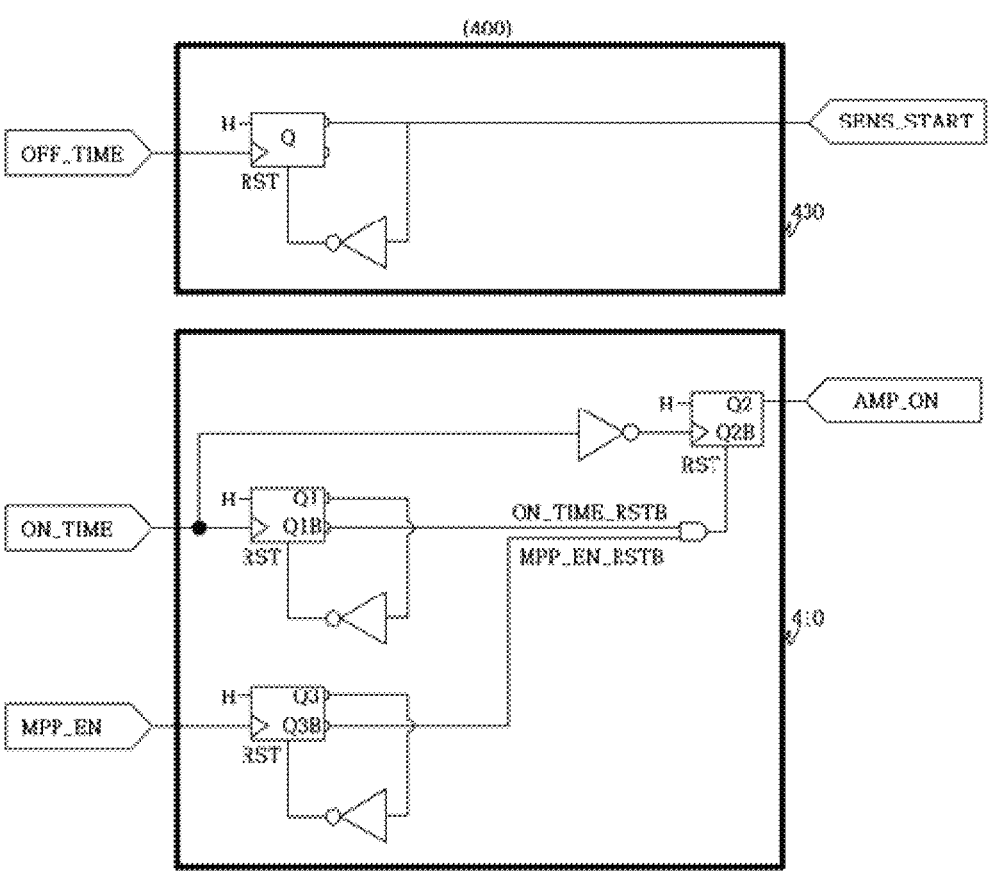
FIG. 8 shows a configuration of an operation controller according to an embodiment of the present invention.

In accordance with another aspect, the boost type power converter may be controlled such that the pre-amplifier of the dynamic comparator is turned on during an off state of the low-side power switch. In association with the boost type power converter to which the proposed invention is applied, the power current detection circuit 280 should operate at a moment when the high-side power switch is switched on. To this end, a signal SENS_START and a signal AMP_ON are prepared in order to enable the zero current detection circuit 280 to operate at a moment when an off-time signal OFF-_TIME becomes an on state. Again referring to FIG. 5, in accordance with this aspect, the boost type power converter according to an embodiment of the proposed invention may further include the operation controller 400. FIG. 8 shows a configuration of the operation controller according to an embodiment. As shown in FIG. 8, the operation controller 400 includes a first operation controller 410. The first operation controller 410 outputs a control signal for activating the comparison circuit 100 during deactivation of an output of the on-time generator 220. Since the off-time signal OFF_TIME is generated after the on-time signal ON_TIME becomes an off state, the operation controller 400 generates a signal AMP_ON at a moment when the on-time signal ON_TIME becomes an off state, in order to activate the pre-amplifier.

In the embodiment of FIG. 4, the on-time signal ON_TIME, which is a control signal output from the on-time generator 220, is input to a clock input terminal of the flip-flop Q2 via an inverter G2. Since a data input terminal of the flip-flop Q2 is always fixed to a high state H, an output of the flip-flop Q2 transitions to a high state when the on-time signal ON_TIME transitions from a high state to a low state. In the embodiment of FIG. 4, when the on-time signal ON_TIME, which is a control signal output from the on-time generator 220, is deactivated, the low-side power switch 213 is switched off and, as such, charging of input power into the main inductor 211 is stopped. At substantially the same time as described above, the off-time generator 230 is activated and, as such, the high-side power switch 215 is switched on. Accordingly, supply of power charged in the main inductor 211 to a load is begun.

<Description of Invention of Claim 9>

As shown in FIG. 8, the first operation controller 410 may include a first flip-flop Q1 configured to be turned on when an on-time signal ON_TIME, which is an output of the on-time generator 220 (FIG. 4), is activated, and a second flip-flop Q2 configured to be turned on when the on-time signal ON_TIME, which is an output of the on-time generator 220, is deactivated, and to be reset by a negative output of the first flip-flop Q1. A signal output from the first operation controller 410, that is, a signal AMP_ON, is applied to the pre-amplifier 111 of the comparison circuit 110, as shown in FIGS. 6 and 7.

A logic associated with the flip-flop Q1 and a flip-flop Q3 in the operation controller 400 is a circuit configured to generate a signal for resetting the flip-flop Q2 configured to generate the signal AMP_ON. During a period in which an on-time signal ON_TIME and a signal MPP_EN respectively applied to clock input terminals of the flip-flops Q1 and Q3 are in an activated state, the logic not only controls the zero current detection circuit not to operate, but also resets an internal logic of the zero current detection circuit in order to prevent occurrence of an erroneous operation. In detail, since data input terminals of the flip-flop Q2 and the flip-flop Q1 are always fixed to a high state H, an output of the flip-flop Q2 transitions to a high state when the on-time signal ON_TIME transitions from a low state to a high state. Accordingly, the pre-amplifier 111 of the comparison circuit 110 may start an operation thereof when the on-time signal ON_TIME is deactivated, and may be reset when the on-time signal ON_TIME is activated.

<Description of Invention of Claim 10>

In addition, the operation controller 400 may further include a second operation controller 430. The second operation controller 430 outputs a signal SENS_START, which is a control signal enabling start of an operation of the clock generator 300 (FIGS. 5 and 6) when an off-time signal OFF_TIME, which is an output of the off-time generator 230 (FIG. 4), is activated. The second operation controller 430 includes a flip-flop Q configured to be always maintained in a high state H at a data input terminal thereof. When the off-time signal OFF_TIME, which is an output of the off-time generator 230), is activated, a signal SENS_START is output from the second operation controller 430 in the form of a pulse.

Figure 10:
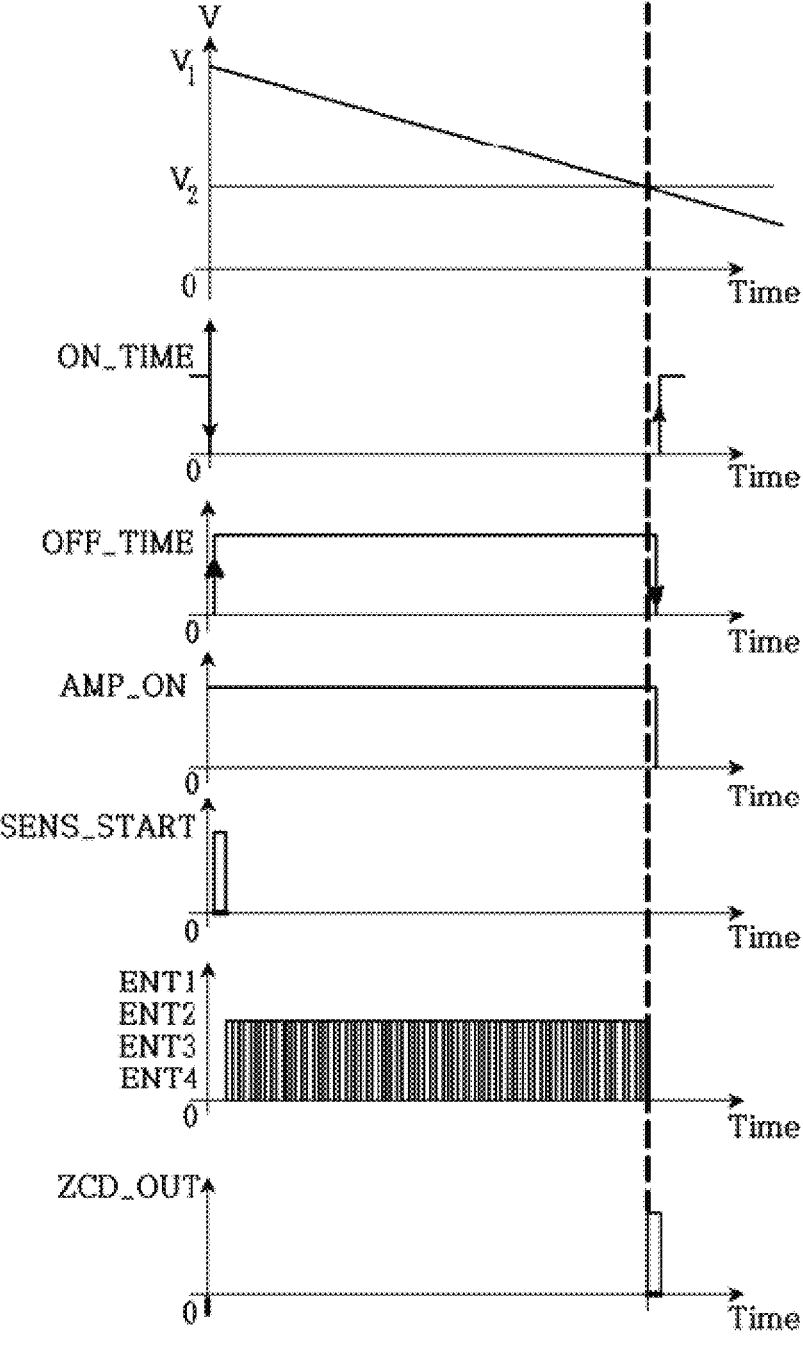
FIG. 10 shows illustrative timings of operation controller-associated signals.

FIG. 10 shows illustrative timings of operation controller-associated signals shown in FIG. 8. As shown in FIG. 10, among voltages of a detection node pair, a voltage $V_{OUT}$ is relatively stable because the voltage $V_{OUT}$ is an output of the power converter, whereas a voltage $V_X$ at an input terminal is varied in accordance with charging and discharging operations of an inverter. Immediately after the on-time signal ON_TIME is deactivated, the signal AMP_ON is activated based on sensing of the deactivated on-time signal ON_TIME. Subsequently, the off-time signal OFF_TIME is activated and, as such, the signal SENS_START is activated.

Thereafter, clocks for activating respective dynamic comparators are generated. For example, the dynamic comparator 110-4, to which a clock ENT4 activated at a moment when the voltage $V_X$ crosses the voltage $V_{OUT}$ is supplied, detects the moment, thereby outputting a pulse, and the output generator 500 externally outputs the pulse as a signal ZCD_OUT.

As apparent from the above description, in accordance with the proposed invention, the zero current detection circuit may achieve a reduction in power consumption because the zero current detection circuit does not require a separate clock circuit. In addition, the proposed zero current detection circuit operates by power supplied thereto only in a required period of a charging/discharging cycle of the boost type power converter and, as such, may reduce power consumption by itself. In accordance with such low-power driving, power conversion circuits in the energy harvesting field may reduce power consumption of a system thereof itself and, as such, may enhance power conversion efficiency.

Furthermore, the zero current detection circuit according to the proposed invention exhibits an enhancement in sensing accuracy for a zero current point because an operation frequency thereof becomes higher as an output of the power conversion circuit, which is a supply voltage, becomes higher. Accordingly, sensing accuracy for the zero current point may be enhanced within a wide voltage range.

Although the present invention has been described through embodiments to referring the accompanying drawings, the present invention is not limited thereto. The present invention should be interpreted as including various modified embodiments obviously derivable by those skilled in the art. The appended claims are intended to include such modified embodiments.

What is claimed is:

1. A zero current detection circuit comprising:
 a comparison circuit comprising a plurality of dynamic comparators each having input terminals respectively connected to a pair of detection nodes;
 a clock generator comprising a plurality of flip-flops each configured to receive, as a clock signal, an output of an upstream one of the dynamic comparators and to output the received signal as a clock input of a downstream one of the dynamic comparators such that entirety of the plurality of flip-flops constitutes a clock loop; and
 an output generator configured to logically OR outputs of the plurality of dynamic comparators, thereby outputting a resultant signal.

2. The zero current detection circuit according to claim 1, wherein each of the dynamic comparators comprises:
 a pre-amplifier configured to differentially amplify input signals; and
 a dynamic latch configured to be synchronized with an input clock, thereby outputting a pulse at a moment when an output of the pre-amplifier becomes 0.

3. The zero current detection circuit according to claim 1, wherein the clock generator is configured such that, to a reset input of each of the flip-flops in the clock loop, an output of an upstream one of the flip-flops is connected.

4. A boost type power converter comprising:

a main inductor;

a low-side power switch configured to regulate charging of input power into the main inductor;

a high-side power switch configured to regulate discharge of power charged in the main inductor to a load;

an on-time generator configured to generate a control signal for the low-side power switch;

an off-time generator configured to generate a control signal for the high-side power switch; and a zero current detection circuit configured to output a zero current detection signal to the on-time generator, wherein the zero current detection circuit comprises:

a plurality of dynamic comparators each configured to receive a voltage of the low-side power switch at a first input terminal thereof and to receive a voltage of the high-side power switch at a second input terminal thereof;

a clock generator comprising a plurality of flip-flops each configured to receive, as a clock signal, an output of one of the dynamic comparators and to output an output signal thereof as a clock input of another one of the dynamic comparators such that entirety of the plurality of flip-flops constitutes a clock loop; and an output generator configured to logically OR outputs of the plurality of dynamic comparators, thereby outputting a resultant signal to the off-time generator.

5. The boost type power converter according to claim 4, wherein each of the dynamic comparators comprises:

a pre-amplifier configured to differentially amplify input signals; and a dynamic latch configured to be synchronized with an input clock, thereby outputting a pulse at a moment when an output of the pre-amplifier becomes 0.

6. The boost type power converter according to claim 4, wherein the clock generator is configured such that, to a reset input of each of the flip-flops in the clock loop, an output of an upstream one of the flip-flops is connected.

7. The boost type power converter according to claim 6, wherein the clock generator further comprises a plurality of AND elements each connected, at an output thereof, to a reset terminal of one of the flip-flops and configured to logically AND an output of another one of the flip-flops upstream of the one flip-flop in the clock loop and an output of the off-time generator.

8. The boost type power converter according to claim 4, further comprising:

an operation controller comprising a first operation controller configured to output: a control signal for activating the comparison circuit during deactivation of an output of the on-time generator.

9. The boost type power converter according to claim 8, wherein the first operation controller comprises:

a first flip-flop configured to be turned on when the output of the on-time generator is activated; and a second flip-flop configured to be turned on when the output of the on-time generator is deactivated and to be reset by a negative output of the first flip-flop.

10. The boost type power converter according to claim 8, wherein the operation controller further comprises:

a second operation controller configured to output a control signal enabling start of an operation of the clock generator when an output of the off-time generator is activated.

\* \* \* \* \*